(12) United States Patent
Yamamoto

(10) Patent No.: US 7,504,316 B2
(45) Date of Patent: Mar. 17, 2009

(54) METHOD AND DEVICE FOR SEPARATING A REINFORCING-PLATE FIXED TO A REINFORCED SEMICONDUCTOR WAFER

(75) Inventor: Masayuki Yamamoto, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 387 days.

(21) Appl. No.: 11/087,214

(22) Filed: Mar. 23, 2005

(65) Prior Publication Data
US 2005/0215030 A1 Sep. 29, 2005

(30) Foreign Application Priority Data
Mar. 24, 2004 (JP) .............................. 2004-087175

(51) Int. Cl.
H01L 21/30 (2006.01)

(52) U.S. Cl. ...................................... 438/458

(58) Field of Classification Search ................. 438/458, 438/200
See application file for complete search history.

(56) References Cited

U.S. PATENT DOCUMENTS

| | | | |
|---|---|---|---|
| 4,977,061 A * | 12/1990 | Suganuma | 430/203 |
| 6,649,017 B1 * | 11/2003 | Kurokawa | 156/344 |
| 6,803,293 B2 * | 10/2004 | Yamamoto | 438/459 |
| 7,112,515 B2 * | 9/2006 | Torvik | 438/459 |
| 7,276,429 B2 * | 10/2007 | Yamanaka | 438/455 |
| 2004/0038469 A1 * | 2/2004 | Yamamoto | 438/200 |
| 2005/0003635 A1 * | 1/2005 | Takekoshi | 438/464 |
| 2005/0048241 A1 * | 3/2005 | Terada et al. | 428/40.1 |
| 2005/0173064 A1 * | 8/2005 | Miyanari | 156/344 |
| 2005/0209380 A1 * | 9/2005 | Wada et al. | 524/270 |
| 2005/0233547 A1 * | 10/2005 | Noda et al. | 438/459 |
| 2006/0019051 A1 * | 1/2006 | Pufahl | 428/40.1 |
| 2006/0057820 A1 * | 3/2006 | Yamanaka | 438/458 |
| 2007/0151674 A1 * | 7/2007 | Miyanari | 156/584 |

FOREIGN PATENT DOCUMENTS

| | | | |
|---|---|---|---|
| JP | 2002329684 | * | 4/2001 |
| JP | 2002-75937 | | 3/2002 |
| JP | 2002-329684 | | 11/2002 |

* cited by examiner

*Primary Examiner*—N Drew Richards
*Assistant Examiner*—Ankush K Singal
(74) *Attorney, Agent, or Firm*—Knobbe Martens Olson & Bear LLP

(57) ABSTRACT

A reinforcing-plate fixed to a reinforced semiconductor wafer is separated from the wafer which includes a semiconductor wafer, a double-side adhesive sheet having, on at least one surface thereof, a peelable adhesive layer stuck to a front face of the semiconductor wafer, and the reinforcing-plate fixed to the other adhesive layer of the double-side adhesive sheet. A method includes separating the reinforcing-plate together with the double-side adhesive sheet from the reinforced semiconductor wafer by the peeling-effect of the peelable adhesive layer of the double-side adhesive sheet. The method further includes separating the reinforcing-plate from an arbitrarily selected edge of the semiconductor wafer toward an edge thereof different from the above-mentioned edge.

18 Claims, 4 Drawing Sheets

TURNING OF THE UPSIDE OF THE SEMICONDUCTOR WAFER DOWN

TURNING OF THE UPSIDE OF THE SEMICONDUCTOR WAFER DOWN

METHOD AND DEVICE FOR SEPARATING A REINFORCING-PLATE FIXED TO A REINFORCED SEMICONDUCTOR WAFER

FIELD OF THE INVENTION

The present invention relates to a method for separating a reinforcing-plate from a reinforced semiconductor wafer to which the reinforcing-plate is fixed through a double side adhesive sheet; and a device used in this method.

BACKGROUND OF THE INVENTION

Hitherto, as a working method for thinning a semiconductor wafer, there have been known mechanical and chemical methods such as grinding, polishing (CMP), and etching methods. In all of these methods, adopted is generally a process of sticking a protecting tape onto a semiconductor wafer front face on which a wiring pattern is formed to perform the protection of the wiring pattern and the fixation of the semiconductor wafer, and then thinning the rear face of the semiconductor wafer.

However, the strength and rigidity of the semiconductor wafer become lower as the semiconductor wafer is made thinner. As a result, the semiconductor wafer is broken due to a reduced strength of the semiconductor wafer, or is warped due to a reduced rigidity thereof. Under such a situation, it is necessary to handle semiconductor wafers with sufficient attention. However, even if semiconductor wafers are handled with sufficient attention, there is caused a problem that the semiconductor wafers are frequently broken so that the yield thereof falls. Additionally, there is caused a problem that the semiconductor wafers cannot be carried with a wafer carrier or the like by due to the reduced strength and rigidity of the semiconductor wafers by the thinning-work thereof, so that work efficiency drops.

Against these problems, there is suggested a method of fixing a reinforcing-plate through a double-side adhesive sheet onto a semiconductor wafer front face on which a pattern is formed and then subjecting the rear face of the reinforced semiconductor wafer to thinning-work (JP-A-2002-75937). Since the reinforcing-plate is easily separated after the semiconductor wafer is subjected to the thinning-work according to this method, this publication suggests using a peelable adhesive type double-side adhesive sheet which can be peeled by an external energy such as heat or ultraviolet ray. For example, in the case of the peeling-effect based on heat about the above-mentioned peelable adhesive type double-side adhesive sheet, the separation of the reinforcing-plate is started by the bubbling of the adhesive layer by action of the heat. In the case of the peeling-effect based on ultraviolet rays, the separation of the reinforcing-plate is started by the curing of the adhesive layer irradiated with the ultraviolet rays. The above-mentioned external energy is given to the whole of a face of the peelable adhesive type double-side adhesive sheet when the reinforcing-plate is separated.

SUMMARY OF THE INVENTION

However, in the case that the above-mentioned method is applied to a reinforced semiconductor wafer comprising a semiconductor wafer having a large diameter, external energy cannot be uniformly given to the whole of a face of the double-side adhesive sheet when the reinforcing-plate is separated. It is therefore difficult to give uniform peelability to the adhesive sheet over the whole of the face of the semiconductor wafer. In other words, in the case of a reinforced semiconductor wafer comprising a semiconductor wafer having a large diameter, external energy cannot be given to the whole of a face of the semiconductor wafer; therefore, in the adhesive sheet, there are generated portions where the separation of the reinforcing-plate is started by the external energy and portions where the separation is not started because the external energy is not sufficiently given. Between these portions different in the peelability, a deformation boundary of the double-side adhesive sheet is generated, so as to result in the following problem: when this boundary turns into a circular form, strain based on deformation is not easily avoided so that the semiconductor wafer is cracked.

In light of such a situation, the present invention has been made. An object of the present invention is to provide a method making it possible to separate the reinforcing-plate from a reinforced semiconductor wafer to which a reinforcing-plate is fixed through a double-side adhesive sheet having a peelable adhesive layer, without breaking the semiconductor wafer. Another object of the present invention is to provide a device used in this method.

To solve the above-mentioned problems, the inventors have repeatedly made eager researches so as to find out that the above-mentioned objects can be attained by the following method or device. Thus, the present invention has been made.

Accordingly, the present invention relates to a method for separating a reinforcing-plate fixed to a reinforced semiconductor wafer; the wafer comprising a semiconductor wafer and a double-side adhesive sheet having a peelable adhesive layer on at least one surface thereof, wherein the peelable adhesive layer is stuck to a front face of the semiconductor wafer and the reinforcing-plate is fixed to the other adhesive layer of the double-side adhesive sheet; and the reinforcing-plate being separated together with the double-side adhesive sheet from the reinforced semiconductor wafer by the peeling-effect of the peelable adhesive layer of the double-side adhesive sheet;

in which the reinforcing-plate is separated from an arbitrarily selected edge of the semiconductor wafer toward an edge thereof different from the above-mentioned edge.

According to this method, at the time of separating the reinforcing-plate from the reinforced semiconductor wafer, the peeling-effect of the peelable adhesive layer of the double-side adhesive sheet is gradually exhibited from the arbitrarily selected edge of the semiconductor wafer to the different edge. For this reason, portions different in peelability are not generated in the peelable area of the double-side adhesive sheet during a period from the start of the separation of the reinforcing-plate to the final peeling thereof. Therefore, the reinforcing-plate can be separated without breaking the semiconductor wafer even if this wafer is a thinning-worked wafer having a large diameter.

In the above-mentioned method for separating a reinforcing-plate fixed to a reinforced semiconductor wafer, the reinforced semiconductor wafer is preferably a semiconductor wafer the rear face of which is subjected to thinning-work in the state that the reinforcing-plate is fixed to the wafer. In the reinforced semiconductor wafer, the reinforcing-plate is fixed through the double-side adhesive sheet to the front face of the semiconductor wafer; therefore, even if the semiconductor wafer is thinned by grinding the rear face of this wafer, strength and rigidity are given to the wafer by action of the reinforcing-plate. Thus, it is possible to prevent the semiconductor wafer from being broken or warped in the step of the thinning-work. Accordingly, the semiconductor wafer is easily handled even if the wafer is subjected to the thinning-work. Moreover, the wafer is easily carried with a wafer carrier or the like, and work efficiency is also good.

In the above-mentioned method for separating a reinforcing-plate fixed to a reinforced semiconductor wafer, the reinforcing-plate is preferably separated linearly from the arbitrarily selected edge of the semiconductor wafer. The reinforcing-plate can easily be separated by exhibiting the effect of the peelable adhesive layer linearly and gradually from the arbitrarily selected edge to the different edge.

In the above-mentioned method for separating a reinforcing-plate fixed to a reinforced semiconductor wafer, the peelable adhesive layer of the double-side adhesive sheet is preferably a thermally-peelable adhesive layer. The thermally-peelable type double-side adhesive sheet having the thermally-peelable adhesive layer makes it possible to remove the reinforcing-plate easily and surely from the front face of the semiconductor wafer by heating.

In the above-mentioned method for separating a reinforcing-plate fixed to a reinforced semiconductor wafer, the peelable adhesive layer of the double-side adhesive sheet is preferably an ultraviolet ray peelable adhesive layer. The ultraviolet ray peelable type double-side adhesive sheet having the ultraviolet ray peelable adhesive layer makes it possible to remove the reinforcing-plate easily and surely from the front face of the semiconductor wafer by the irradiation thereof with ultraviolet rays. When the ultraviolet ray peelable type double-side adhesive sheet is used, it is preferable to use, as the reinforcing-plate, a transparent reinforcing-plate in order to cure the ultraviolet ray peelable adhesive layer.

The present invention also relates to a device used in the above-mentioned method for separating a reinforcing-plate fixed to a reinforced semiconductor wafer, comprising a mechanism for fixing a reinforced semiconductor wafer, and a mechanism for giving external energy which exhibits the peeling agency of a peelable adhesive layer linearly from an arbitrarily selected edge of the reinforced semiconductor wafer. This device makes it possible to give external energy linearly from the arbitrarily selected edge of the reinforced semiconductor wafer to exhibit the peeling-effect of the peelable adhesive layer gradually from the edge, whereby the reinforcing-plate can easily be separated from the edge of the reinforced semiconductor wafer without breaking the semiconductor wafer.

The present invention also relates to a device used in the above-mentioned method for separating a reinforcing-plate fixed to a reinforced semiconductor wafer, comprising a mechanism for fixing a reinforced semiconductor wafer, and a mechanism for heating the reinforced semiconductor wafer linearly from an arbitrarily selected edge of the wafer. This device is used in the case that a peelable adhesive layer of a double-side adhesive sheet is a thermally-peelable adhesive layer, and the device makes it possible to heat the reinforced semiconductor wafer linearly from the arbitrarily selected edge thereof, thereby easily separating the reinforcing-plate from the edge of the reinforced semiconductor wafer without breaking the semiconductor wafer.

The present invention also relates to a device used in the above-mentioned method for separating a reinforcing-plate fixed to a reinforced semiconductor wafer, comprising a mechanism for fixing a reinforced semiconductor wafer, and a mechanism for radiating ultraviolet rays onto the reinforced semiconductor wafer linearly from an arbitrarily selected edge of the wafer. This device is used in the case that a peelable adhesive layer of a double-side adhesive sheet is an ultraviolet ray curable adhesive layer, and the device makes it possible to radiate ultraviolet rays onto the reinforced semiconductor wafer linearly from the arbitrarily selected edge thereof, thereby easily separating the reinforcing-plate from the edge of the reinforced semiconductor wafer without breaking the semiconductor wafer.

BRIEF DESCRIPTION OF THE DRAWINGS

Further objects, features and superior points of the present invention will be sufficiently understood from the following description. Advantageous effects of the present invention will be made evident from the following description with reference the attached drawings.

DESCRIPTION OF THE EMBODIMENTS

Hereinafter, the method of the present invention for separating a reinforcing-plate fixed to a reinforced semiconductor wafer is described about preferred embodiments thereof with reference to the drawings.

FIGS. 1(A) to 1(D) are concerned with a reinforced semiconductor wafer to which a reinforcing-plate is fixed through a double-side adhesive sheet. The rear face of the wafer is subjected to thinning-work.

Figure 1A:
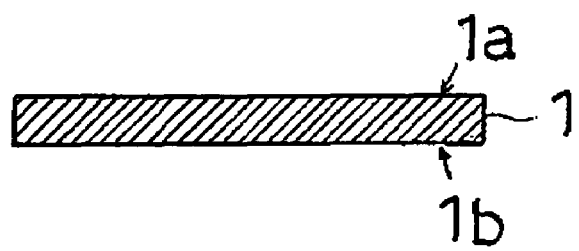
FIGS. 1(A) to 1(D) are each a process chart for explaining a reinforced semiconductor wafer subjected to thinning-work in the present invention.

FIG. 1(A) illustrates a semiconductor wafer 1 having a front face 1$a$ on which a wiring pattern is formed and a rear face 1$b$ opposite thereto. The wiring pattern formed on the front face 1$a$ has a desired pattern formed in a usual way. The diameter of the semiconductor wafer 1 is not particularly limited. Preferably, the diameter is made large since the large-diameter wafer has a relatively small thickness. Specifically, the diameter is preferably 200 mm or more, more preferably 300 mm or more.

Figure 1B:
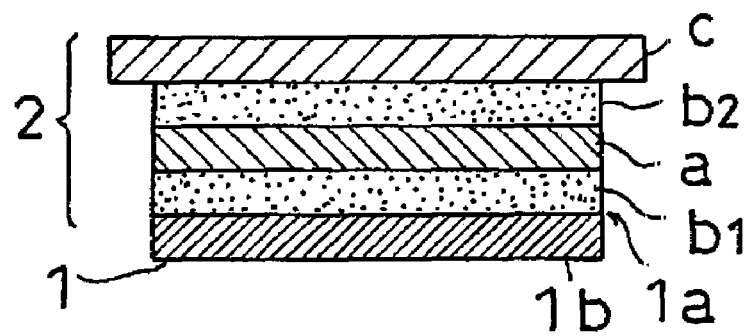

As illustrated in FIG. 1(B), a double-side adhesive sheet 2 is stuck onto the front face 1$a$ of the semiconductor wafer 1. The double-side adhesive sheet 2 has a peelable adhesive layer 2$b_1$ on the side to which a semiconductor wafer is stuck, and has an adhesive layer 2$b_2$ for fixing a reinforcing-plate on the other side. The adhesive layer 2$b_2$ has thereon a releasing sheet 2$c$. This double-side adhesive sheet 2 is stuck onto the semiconductor wafer 1 by peeling, from a label punched into the same shape that the semiconductor wafer 1 has and supported on a releasing support sheet, the label and further positioning the label and the semiconductor wafer 1. In this step of sticking the double-side adhesive sheet, the semiconductor wafer 1 is usually fixed on a chuck table.

The double-side adhesive sheet used in the sticking step may not be in the form of the label punched into the same shape that the semiconductor wafer has, and may be in a sheet form. In this case, the double-side adhesive sheet is cut into the same shape that the semiconductor wafer has after the sheet is stuck onto the wafer.

A member which has been used as the base layer of any conventional double-side adhesive sheet can be used, without any especial limitation, as a base layer 2$a$ of the double-side adhesive sheet 2. The base layer 2$a$ is, for example, a mono-axial or biaxial drawn film made of polyethylene terephthalate, polyethylene, polystyrene, polypropylene, nylon, urethane, polyvinylidene chloride or polyvinyl chloride. The thickness of the base layer 2$a$ is usually from about 30 to 200 µm.

The adhesive agent constituting the adhesive layers 2$b_1$ or 2$b_2$ may be selected from various adhesive agents such as acrylic, rubbery, silicone and polyvinyl ether adhesive agents. As the peelable adhesive layer $2b_1$ to be stuck onto the semiconductor wafer front face $1a$, a peelable adhesive agent is used which makes it possible to lower the adhesive force to the semiconductor wafer front face $1a$ after thinning-work. Examples of this adhesive agent include an ultraviolet ray curable adhesive agent, and a thermally-bubbling adhesive agent. The thermally-bubbling adhesive agent is preferable among these agents since the peeling of the double-side adhesive sheet is made easy.

The adhesive layer $2b_2$ may not be a peelable adhesive layer, or may be a peelable adhesive layer similar to the adhesive layer $2b_1$. In the case that a peelable adhesive layer is used as the adhesive layer $2b_2$, it is possible to lower the adhesive force of a reinforcing-plate 3 after the reinforcing-plate 3 is separated from the semiconductor wafer 1, and reuse the reinforcing-plate 3 easily (see FIG. 2(C)). On the other hand, in the case that a peelable adhesive layer is used in both of the adhesive layers $2b_1$ and $2b_2$, it is preferable that the following is used in the adhesive layer $2b_2$, which is peeled after the adhesive layer $2b_1$ is peeled: an adhesive agent which should receive severer peeling conditions (for example, a thermally-bubbling adhesive agent which generates thermally bubbles at a higher temperature) than peeling conditions which the adhesive layer $2b_1$ should receive. The thickness of each of the adhesive layers $2b_1$ and $2b_2$ is usually from about 20 to 200 µm. An example of the thermally-peelable adhesive sheet is a product sold under the trade name "REVALPHA" and manufactured by Nitto Denko Corp.

Figure 1C:
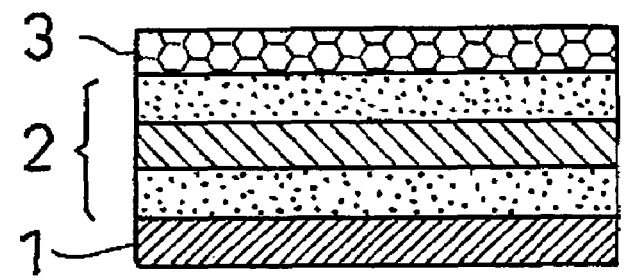

Next, the releasing sheet $2c$ is peeled, and a reinforcing-plate 3 positioned in place is stuck onto the adhesive layer $2b_2$, as illustrated in FIG. 1(C), so as to produce a reinforced semiconductor wafer. Besides this method, the following method also makes it possible to produce the reinforced semiconductor wafer: a method of sticking the double-side adhesive sheet onto the reinforcing-plate, and sticking this onto the semiconductor wafer front face $1a$.

The material of the reinforcing-plate 3 is not limited to any especial kind if the material makes the reinforcement of the semiconductor wafer 1 possible. Examples thereof include glass, metal, hard plastic, and the same material that constitutes the semiconductor wafer. Of these materials, the same material that constitutes the semiconductor wafer is preferable in order to restrain the semiconductor wafer 1 from being broken. The shape, size and so on of the reinforcing-plate 3 are not particularly limited if they permit the semiconductor wafer rear face $1b$ to be thinning-worked. Preferably, a reinforcing-plate having the same size as the semiconductor wafer 1 is used as shown in FIG. 1(C). The thickness of the reinforcing-plate 3 is usually from about 300 to 3000 µm, preferably from 500 to 1000 µm.

FIGS. 1(A) to 1(D) have illustrated the semiconductor wafer which is not made into chip-form pieces, but the present invention can be applied to a semiconductor wafer made into chip-form pieces.

The positioning between the double-side adhesive sheet 2 and the semiconductor wafer 1 in FIG. 1(B), and the positioning between the semiconductor wafer 1 and the reinforcing-plate 3 in FIG. 1(C) are performed by means of an image recognizing device, and can be attained by recognizing correct positions thereof and then amending the difference between the positions and the positions thereof at present.

Figure 1D:
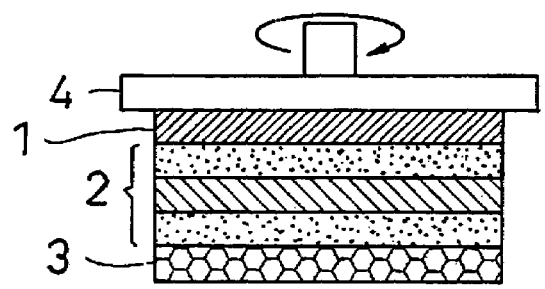

As illustrated in FIG. 1(D), the upside of the semiconductor wafer 1 is turned down, and the reinforcing-plate 3 is chucked to subject the semiconductor wafer rear face $1b$ to thinning-work. For the thinning-work, the usual way can be adopted. A thinning-work machine 4 may be a grinder (back grinder), a CMP pad or the like. The thinning-work is performed until the thickness of the semiconductor wafer 1 becomes a desired value.

Figure 2A:
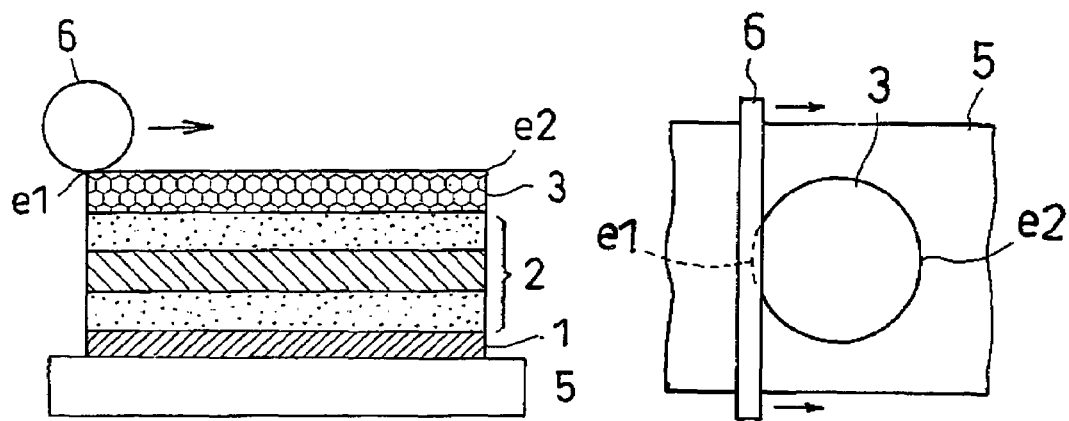
FIGS. 2(A) to 2(C) are each a process chart for explaining a method of the present invention for separating a reinforcing-plate fixed to a reinforced semiconductor wafer.
Figure 2B:
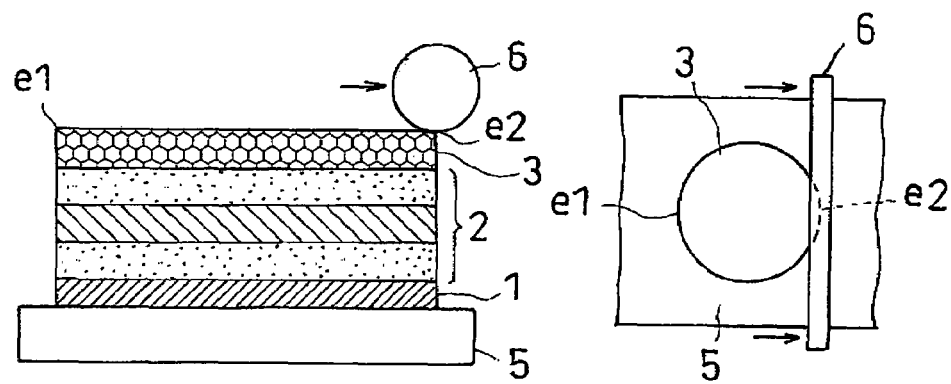
Figure 2C:
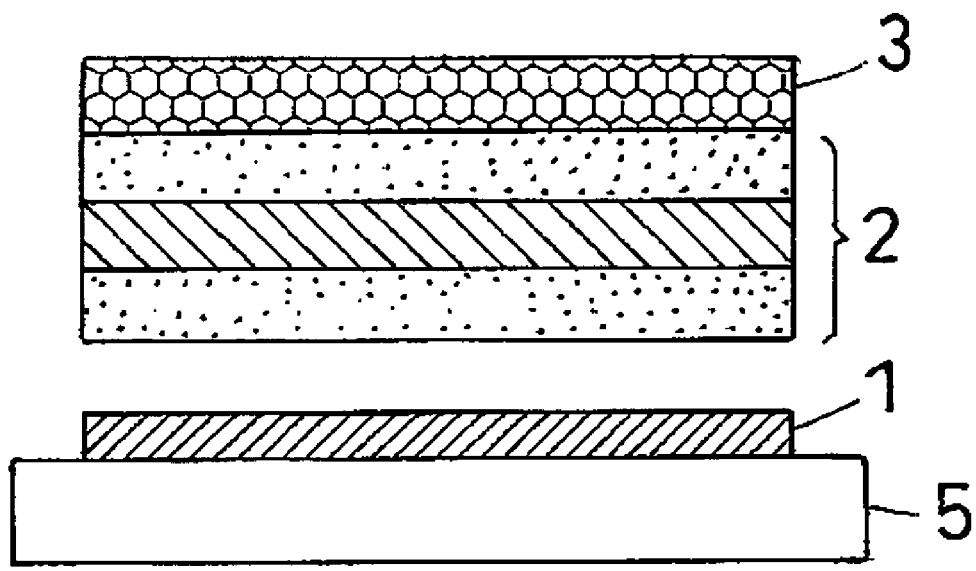

Next, FIGS. 2(A) to 2(C) illustrate steps in the method of the present invention for separating a reinforcing-plate fixed to a reinforced semiconductor wafer. In each of the FIGS. 2(A) and 2(B), a view from the above is shown on the right side of the process chart. FIGS. 2(A) to 2(C) illustrate a case of using the reinforced semiconductor wafer obtained as illustrated in FIG. 1(D), wherein the rear face of the semiconductor wafer 1 is thinning-worked. In FIG. 2(A), the upside of the reinforced semiconductor wafer illustrated in FIG. 1(D), about which the thinning-work is finished, is turned down, and the wafer is held in a fixing mechanism 5 in the state that the reinforcing-plate 3 side is directed upwards. The fixing mechanism 5 is not limited to any especial kind, and may be, for example, a chuck table for adsorbing and fixing an article by vacuum, static electricity or the like.

Next, as illustrated in FIG. 2(A), external energy for generating the peeling agency of the peelable adhesive layer $2b_1$ of the double-side adhesive sheet 2 is given from an arbitrarily selected edge $e_1$ of the semiconductor wafer 1 toward an edge $e_2$ as illustrated in FIG. 2(B). In the case that the peelable adhesive layer $2b_1$ is a thermally-peelable adhesive layer, heating treatment is conducted from the arbitrarily selected edge $e_1$ toward the different edge $e_2$. The heating treatment is conducted at not lower than a temperature at which the thermally-peelable adhesive layer generates peeling agency. In the case that the peelable adhesive layer $2b_1$ is an ultraviolet ray peelable adhesive layer, ultraviolet ray radiating treatment is conducted from the arbitrarily selected edge $e_1$ toward the different edge $e_2$. The ultraviolet ray radiating treatment is conducted at not less than an illuminance at which the ultraviolet ray peelable adhesive layer generates peeling agency. By the heating treatment, the ultraviolet ray radiating treatment or the like, the peeling agency of the peelable adhesive layer $2b_1$ of the double-side adhesive sheet is gradually generated. Consequently, from the edge $e_1$ toward the different edge $e_2$, the adhesive force of the peelable adhesive layer $2b_1$ is successively lowered at such a degree that the peeling is made possible.

Preferably, the external energy supply, such as the heating treatment or ultraviolet ray treatment, is linearly conducted. Examples of the linearly-heating treatment include a method of bringing a heating roller or a heating plate into contact with the reinforced semiconductor wafer from the arbitrarily selected edge $e_1$ toward the different edge $e_2$, and a method of blowing hot wind linearly. An example of the linear ultraviolet ray treatment is a method of radiating ultraviolet rays from a linear lamp onto the reinforced semiconductor wafer from the arbitrarily selected edge $e_1$ toward the different edge $e_2$.

The action of the mechanism for giving external energy, such as the heat treatment mechanism or ultraviolet treatment mechanism, and the mechanism for fixing the reinforced semiconductor wafer may be any action that can produce the peeling agency based on the above-mentioned treatment mechanism to the reinforced semiconductor wafer. This action can be attained by, for example, the shift of at least one of the mechanisms in the direction along which the peeling agency is produced. Accordingly, the external-energy-giving mechanism or the fixing mechanism may be shifted, or both of them may be shifted in reverse directions.

FIGS. 2(A) to 2(C) have illustrated the case that the reinforced semiconductor wafer is subjected to heating treatment with a heating roller 6 as the external-energy-giving mechanism. In FIGS. 2(A) to 2(C), therefore, a thermally-peelable adhesive layer is used as the peelable adhesive layer $2b_1$ of the double-side adhesive sheet 2. In FIG. 2(A), the heating roller 6 drawn back from above the fixing mechanism is brought into contact with the reinforcing-plate 3 at the time of starting heating treatment, so that heating is started from the arbitrarily selected edge $e_1$. In this way, the reinforcing-plate 3 is peeled. The heating roller 6 is not limited to any especial kind, and may by, for example, a roller into which a rod-form heater is fitted. As illustrated in FIG. 2(B), the heating roller 6 is shifted from the arbitrarily selected edge $e_1$ toward the different edge $e_2$. During this, the heating roller 6 is rotated and moved on the reinforcing-plate 3, thereby heating the reinforced semiconductor wafer successively from the arbitrarily selected edge $e_1$ toward the different edge $e_2$. The heating with the heating roller 6 is applied linearly to the reinforced semiconductor wafer.

The temperature of the heating roller 6 is set to a temperature not lower than a temperature necessary for the peeling agency of the thermally-peelable adhesive layer. The heating roller 6 is preferably at such a level that the lowest end thereof slightly contacts the upper face of the reinforcing-plate 3. The shifting speed of the heating roller 6 from the arbitrarily selected edge $e_1$ to the different edge $e_2$ is not particularly limited, and is preferably made low. Specifically, the speed is preferably from 1 to 50 mm/s, more preferably from 5 to 20 mm/s.

FIGS. 2(A) to 2(C) have illustrated the case that heating treatment is conducted by moving and rotating the heating roller 6. However, the shape of the heating roller 6 is not particularly limited. The heating roller 6 may be any roller capable of conducting heating treatment. Thus, the heating roller 6 may not be moved or rotated. FIGS. 2(A) to 2(C) have also illustrated the case that the reinforcing-plate 3 is heated from the upper part thereof with the heating roller 6. However, the heating treatment may be conducted from any one of the upper and lower sides and the right and left sides.

Thereafter, as illustrated in FIG. 2(C), the reinforcing-plate 3 is removed. In FIG. 2(C), an arm or the like for removing the reinforcing-plate 3 may be fitted to the device of the present invention in order to remove the reinforcing-plate 3.

The semiconductor wafer 3, from which the reinforcing-plate 3 is separated, is transferred to a dicing step. In the dicing step, the semiconductor wafer is divided into the form of chips.

The specific embodiments or examples in the item "DESCRIPTION OF THE EMBODIMENTS" are merely ones made the technical content of the present invention evident, and the present invention should not be interpreted in a narrow sense, so as not to be limited only to the specific embodiments or examples. The present invention can be carried out with modification within the scope of the sprit of the present invention and the following claims.

What is claimed is:

1. A manufacturing method of a semiconductor device;
   the wafer comprising a semiconductor wafer and a double-side adhesive sheet having, on at least one surface thereof, a peelable adhesive layer, wherein the peelable adhesive layer is stuck to a front face of the semiconductor wafer and the reinforcing-plate is fixed to the other adhesive layer of the double-side adhesive sheet;
   the reinforcing-plate being separated together with the double-side adhesive sheet from the reinforced semiconductor wafer by the peeling-effect of the peelable adhesive layer of the double-side adhesive sheet; in which the reinforcing-plate is separated from an arbitrarily selected edge of the semiconductor wafer toward an edge thereof different from the above-mentioned edge; and the semiconductor wafer, from which the reinforcing-plate has been separated, is transferred to a dicing step wherein the semiconductor wafer is divided into chips.

2. The method for separating a reinforcing-plate fixed to a reinforced semiconductor wafer according to claim 1, wherein the reinforced semiconductor wafer is a semiconductor wafer the rear face of which is subjected to thinning-work in the state that the reinforcing-plate is fixed to the wafer.

3. The method for separating a reinforcing-plate fixed to a reinforced semiconductor wafer according to claim 1, wherein the reinforcing-plate is separated linearly from the arbitrarily selected edge of the semiconductor wafer.

4. The method for separating a reinforcing-plate fixed to a reinforced semiconductor wafer according to claim 1, wherein the peelable adhesive layer of the double-side adhesive sheet is a thermally-peelable adhesive layer.

5. The method for separating a reinforcing-plate fixed to a reinforced semiconductor wafer according to claim 1, wherein the peelable adhesive layer of the double-side adhesive sheet is an ultraviolet ray peelable adhesive layer.

6. The method for separating a reinforcing-plate fixed to a reinforced semiconductor wafer according to claim 1, wherein the reinforcing-plate is separated after an external energy is linearly applied perpendicular to the direction of separation of the reinforcing-plate.

7. A device used in the method for separating a reinforcing-plate fixed to a reinforced semiconductor wafer according to claim 3, comprising a mechanism for fixing a reinforced semiconductor wafer, and a mechanism for giving external energy which exhibits the peeling agency of a peelable adhesive layer linearly from an arbitrarily selected edge of the reinforced semiconductor wafer.

8. A device used in the method for separating a reinforcing-plate fixed to a reinforced semiconductor wafer according to claim 4, comprising a mechanism for fixing a reinforced semiconductor wafer, and a mechanism for heating the reinforced semiconductor wafer linearly from an arbitrarily selected edge of the wafer.

9. A device used in the method for separating a reinforcing-plate fixed to a reinforced semiconductor wafer according to claim 5, comprising a mechanism for fixing a reinforced semiconductor wafer, and a mechanism for radiating ultraviolet rays onto the reinforced semiconductor wafer linearly from an arbitrarily selected edge of the wafer.

10. The method for separating a reinforcing-plate fixed to a reinforced semiconductor wafer according to claim 6, wherein a linear heating roller or a linear ultraviolet lamp supplies the external energy.

11. The method for separating a reinforcing-plate fixed to a reinforced semiconductor wafer according to claim 10, wherein the heating roller supplies the external energy, and the heating roller is applied by rolling the heating roller over the reinforcing-plate.

12. The method for separating a reinforcing-plate fixed to a reinforced semiconductor wafer according to claim 11, wherein the shifting speed of the heating roller is 1 to 50 mm/s.

13. A method for processing a semiconductor wafer, comprising:
   providing a reinforced semiconductor wafer comprising (i) a semiconductor wafer, (ii) a double-side adhesive sheet, one side of which is a peelable adhesive layer stuck to a front face of the semiconductor wafer, and (iii) a reinforcing-plate fixed to the other side of the double-side adhesive sheet;

processing a rear face of the semiconductor wafer to which the reinforcing-plate remains fixed;

loosening adhesion of the peelable adhesive layer using external energy;

separating the reinforcing-plate together with the double-side adhesive sheet from the semiconductor wafer from an edge of the semiconductor wafer toward another edge as the loosening of the peelable adhesive layer progresses; and transferring the semiconductor wafer, from which the reinforcing-plate has been separated, to a dicing step wherein the semiconductor wafer is divided into chips.

14. The method according to claim 13, wherein the processing of the rear face of the semiconductor wafer is thinning-work.

15. The method according to claim 13, wherein the separation of the reinforcing-plate is conducted in a linear direction from the edge to the other edge of the semiconductor wafer.

16. The method according to claim 13, wherein the peelable adhesive layer of the double-side adhesive sheet is a thermally-peelable adhesive layer, and the external energy is thermal energy.

17. The method according to claim 13, wherein the peelable adhesive layer of the double-side adhesive sheet is an ultraviolet ray peelable adhesive layer, and the external energy is ultraviolet energy.

18. The method according to claim 13, wherein the external energy is applied by a roller which moves on a surface of the reinforcing-plate.

* * * * *